United States Patent
Lin et al.

(10) Patent No.: US 11,122,702 B1
(45) Date of Patent: Sep. 14, 2021

(54) MONITOR SUPPORT DEVICE AND A DISPLAY APPARATUS HAVING THE SAME

(71) Applicant: FOSITEK CORPORATION, New Taipei (TW)

(72) Inventors: Chun-Han Lin, New Taipei (TW); Tzu-Hao Lin, New Taipei (TW)

(73) Assignee: FOSITEK CORPORATION, New Taipei (TW)

(*) Notice: Subject to any disclaimer, the term of this patent is extended or adjusted under 35 U.S.C. 154(b) by 0 days.

(21) Appl. No.: 16/931,103

(22) Filed: Jul. 16, 2020

(30) Foreign Application Priority Data

Apr. 16, 2020 (TW) ................. 109112762

(51) Int. Cl.
  *H05K 5/02* (2006.01)
  *H05K 5/00* (2006.01)
  *F16M 11/06* (2006.01)

(52) U.S. Cl.
  CPC ........... *H05K 5/0234* (2013.01); *F16M 11/06* (2013.01); *H05K 5/0017* (2013.01); *H05K 5/0021* (2013.01)

(58) Field of Classification Search
  None
  See application file for complete search history.

(56) References Cited

U.S. PATENT DOCUMENTS

| 7,529,083 | B2* | 5/2009 | Jeong ................. | F16M 11/2085 361/679.04 |
| 7,623,342 | B2* | 11/2009 | Ozolins ................ | F16M 11/105 16/361 |
| 8,000,090 | B2* | 8/2011 | Moscovitch ....... | F16M 11/2064 361/679.04 |
| 8,083,189 | B2* | 12/2011 | Sun ........................ | F16M 13/02 248/122.1 |
| 8,162,268 | B1* | 4/2012 | Huang ............... | F16M 11/2085 248/124.1 |
| 8,473,853 | B2* | 6/2013 | Gage ..................... | G06F 1/1626 715/761 |
| 9,837,002 | B2* | 12/2017 | Pyc ........................ | G09F 15/02 |
| 2003/0001795 | A1* | 1/2003 | Stasko .................. | F16M 11/22 345/1.1 |
| 2006/0283064 | A1* | 12/2006 | Coe ..................... | G09F 15/0068 40/533 |
| 2007/0086155 | A1* | 4/2007 | Chen ..................... | G06F 1/1616 361/679.06 |
| 2007/0252060 | A1* | 11/2007 | McPherson ............ | F16M 11/18 248/282.1 |

(Continued)

*Primary Examiner* — Xanthia C Cunningham
(74) *Attorney, Agent, or Firm* — Birch, Stewart, Kolasch & Birch, LLP

(57) ABSTRACT

A monitor support device includes a base support and first and second supports mounted to the base support. The first support includes a first connecting body rotatable about a first rotational axis, and a first mounting body adapted to be mounted with a first monitor and rotatable relative to said first connecting body about a second rotational axis. The second support includes a second connecting body rotatable about the first rotational axis, and a second mounting body adapted to be mounted with a second monitor and rotatable relative to said second connecting body about a third rotational axis. The second and third rotational axes each defines an 45° angle with the first rotational axis.

8 Claims, 14 Drawing Sheets

(56) References Cited

U.S. PATENT DOCUMENTS

| | | | | |
|---|---|---|---|---|
| 2008/0198096 A1* | 8/2008 | Jung | ................ | G09G 3/20 |
| | | | | 345/1.3 |
| 2009/0090825 A1* | 4/2009 | Jung | ................ | G06F 1/1601 |
| | | | | 248/205.1 |
| 2009/0161302 A1* | 6/2009 | Ferren | ................ | B60K 35/00 |
| | | | | 361/679.01 |
| 2009/0302176 A1* | 12/2009 | Kuroi | ................ | G03B 21/58 |
| | | | | 248/176.3 |
| 2010/0116961 A1* | 5/2010 | Moscovitch | ................ | F16M 13/02 |
| | | | | 248/371 |
| 2012/0224311 A1* | 9/2012 | Sutherland | ................ | G06K 9/00335 |
| | | | | 361/679.01 |
| 2013/0027618 A1* | 1/2013 | Chen | ................ | F16M 11/2092 |
| | | | | 348/836 |
| 2015/0211675 A1* | 7/2015 | Shyu | ................ | F16M 11/105 |
| | | | | 248/125.7 |
| 2015/0234433 A1* | 8/2015 | Huang | ................ | G06F 1/1652 |
| | | | | 361/679.26 |
| 2017/0339800 A1* | 11/2017 | Burns | ................ | G06F 1/1622 |
| 2020/0326032 A1* | 10/2020 | Kaufmann | ................ | F16M 13/022 |

* cited by examiner

MONITOR SUPPORT DEVICE AND A DISPLAY APPARATUS HAVING THE SAME

CROSS-REFERENCE TO RELATED APPLICATION

This application claims priority of Taiwanese Invention Patent Application No. 109112762, filed on Apr. 16, 2020.

FIELD

The disclosure relates to a monitor support device, more particularly to a monitor support device for two monitors and a display apparatus having the same.

BACKGROUND

In recent years, a dual monitor set up has become popular for many users. However, a conventional monitor support device for this type of setup is usually rigid in structure and do not allow the two monitors to be adjusted to different configurations depending on the needs of a user.

SUMMARY

Therefore, the object of the disclosure is to provide a monitor support device and a display apparatus having the same which can alleviate the drawback of the prior art.

According to a first aspect of the disclosure, a monitor support device is adapted to be mounted with substantially rectangular first and second monitors. The monitor support device includes a base support elongated in a first direction and having a connecting portion, and first and second supports respectively disposed on opposite sides of the connecting portion of the base support in a second direction which is perpendicular to the first direction.

The first support includes a first connecting body and a first mounting body. The first connecting body is mounted to the connecting portion of the base support, and is rotatable relative to the base support about a first rotational axis which extends in the second direction. The first mounting body is mounted to an end of the first connecting body distal from the base support, is adapted to be mounted with the first monitor, and is rotatable relative to the first connecting body about a second rotational axis. The first and second rotational axes define a 45° angle therebetween.

The second support includes a second connecting body and a second mounting body. The second connecting body is mounted to the connecting portion of the base support, and is rotatable relative to the base support about the first rotational axis. The second mounting body is mounted to an end of the second connecting body distal from the base support, is adapted to be mounted with the second monitor, and is rotatable relative to the second connecting body about a third rotational axis. The first and third rotational axes define a 45° angle therebetween.

According to a second aspect of the disclosure, a display apparatus includes a substantially rectangular first monitor, a substantially rectangular second monitor, and a monitor support device. The monitor support device includes a base support that is elongated in a first direction and that has a connecting portion, and first and second supports that are respectively disposed at opposite sides of the connecting portion of the base support in a second direction which is perpendicular to the first direction.

The first support includes a first connecting body and a first mounting body. The first connecting body is mounted to the connecting portion of the base support, and is rotatable relative to the base support about a first rotational axis which extends in the second direction. The first mounting body is mounted to an end of the first connecting body distal from the base support, is mounted with the first monitor, and is rotatable relative to the second connecting body about a second rotational axis. The first and second rotational axes define a 45° angle therebetween.

The second support includes a second connecting body and a second mounting body. The second connecting body is mounted to the connecting portion of the base support, and is rotatable relative to the base support about the first rotational axis. The second mounting body is mounted to an end of the second connecting body distal from the base support, is mounted with the second monitor, and is rotatable relative to the second connecting body about a third rotational axis. The first and third rotational axes define a 45° angle therebetween.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
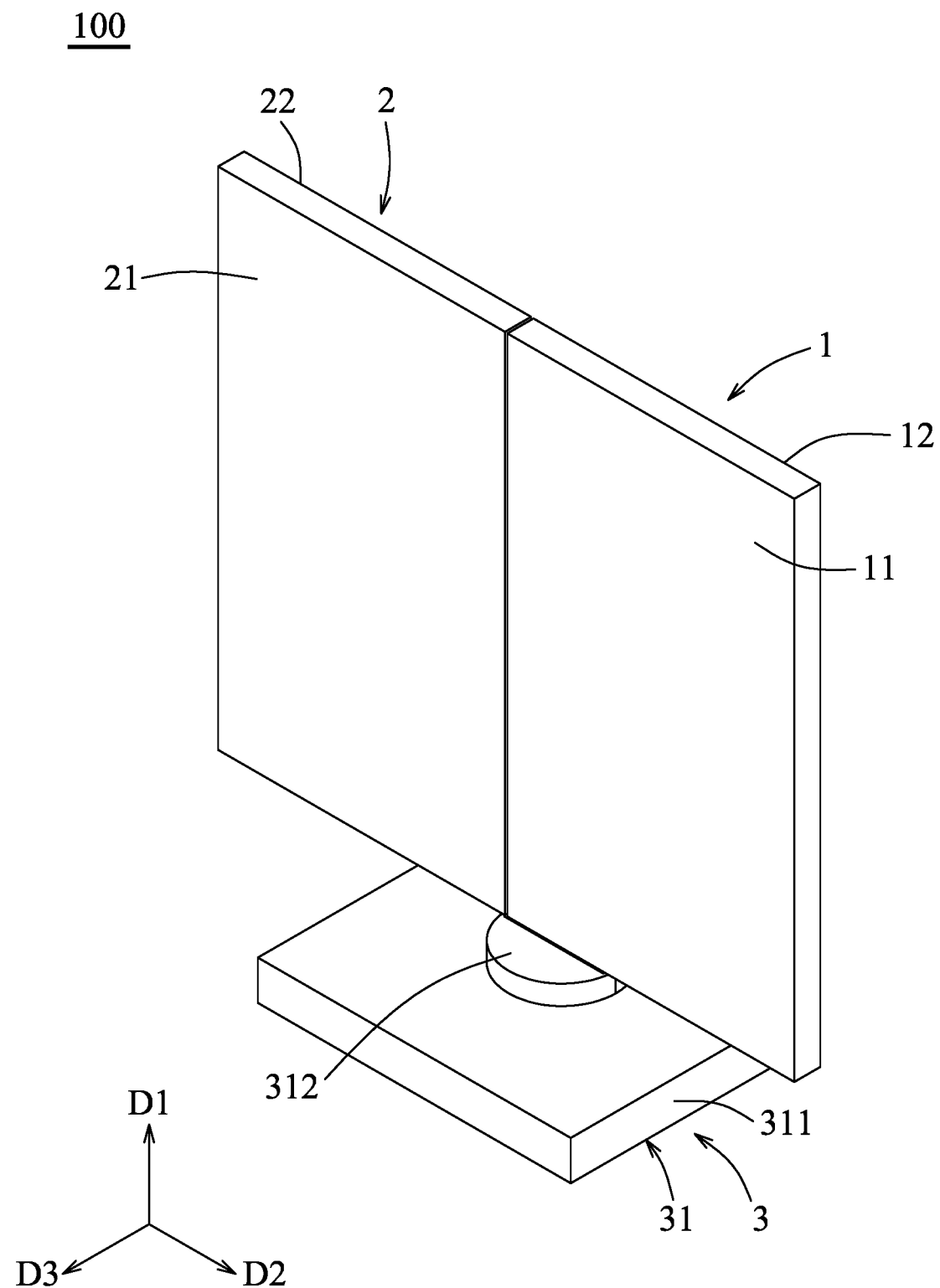
FIG. 1 is a perspective view of an embodiment of a display apparatus according to the disclosure illustrating first and second monitors both in a vertical orientation and a front-facing state.
Figure 2:
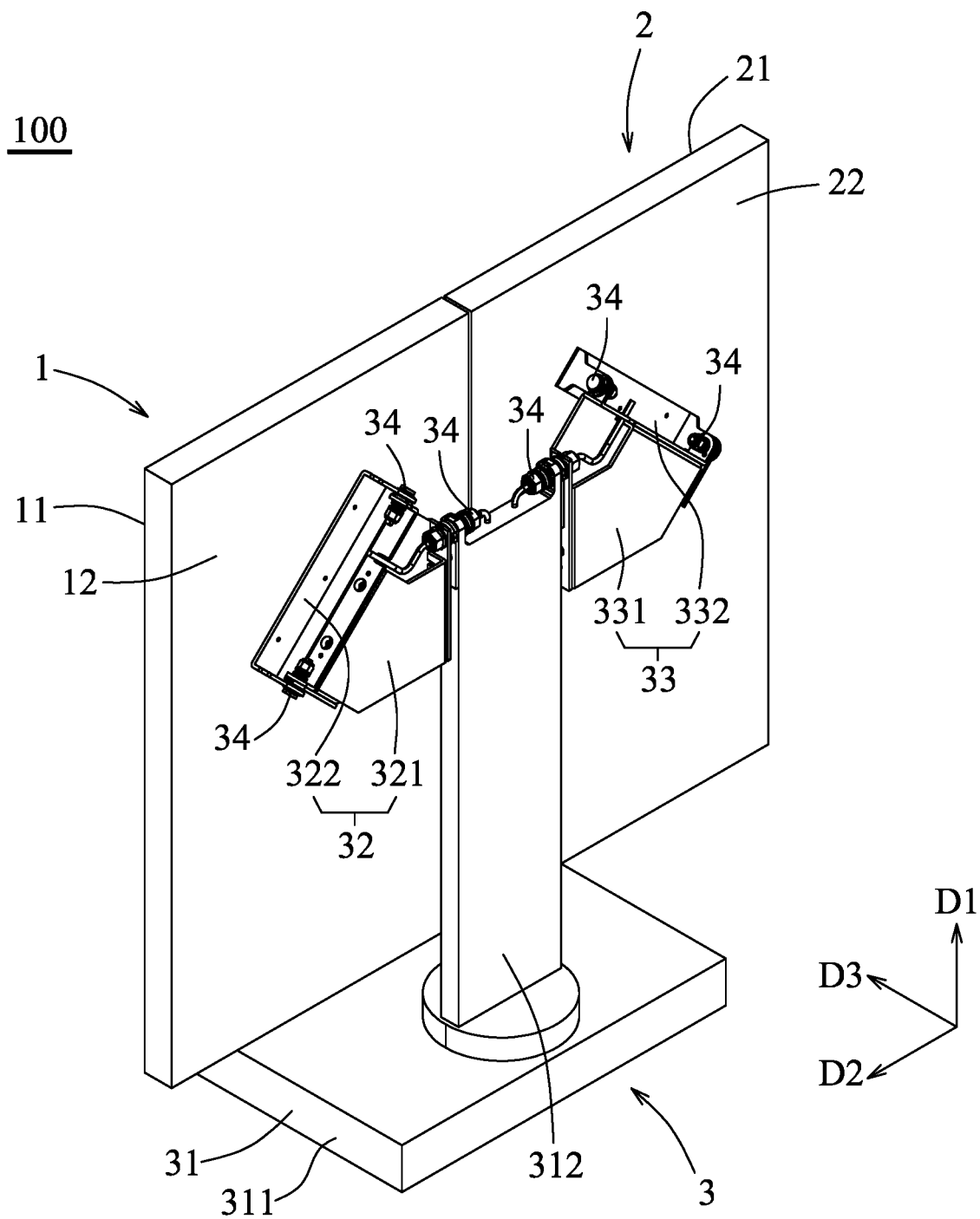
FIG. 2 is a perspective view of the embodiment at an angle different from FIG. 1.
Figure 3:
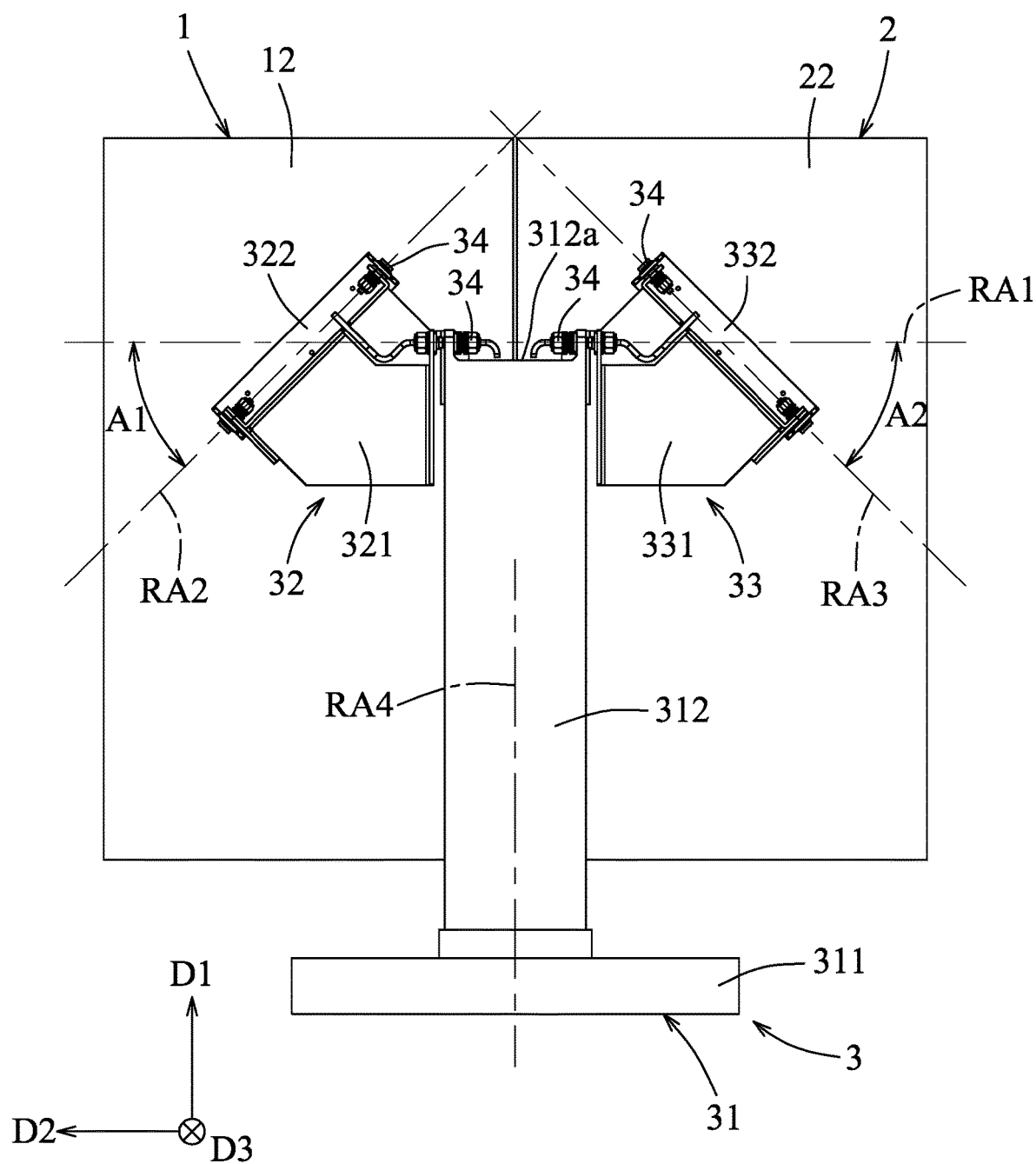
FIG. 3 is a side view of FIG. 1.
Figure 4:
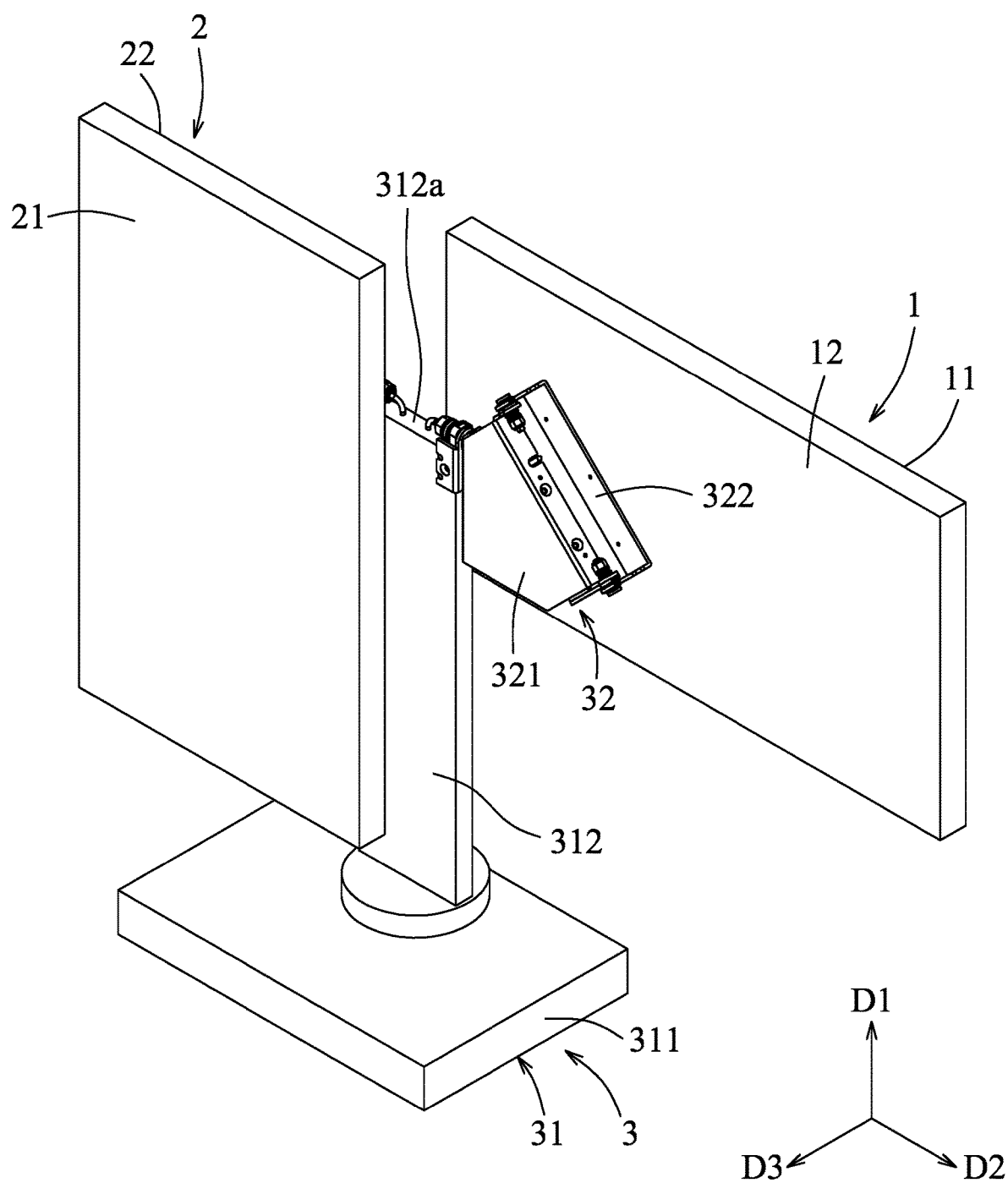
FIG. 4 is a perspective view of the embodiment, illustrating the first monitor in a horizontal orientation and a rear-facing state and the second monitor in the vertical orientation and the front-facing state.

Referring to FIGS. 1 to 3, an embodiment of a display apparatus 100 includes a first monitor 1, a second monitor 2, and a monitor support device 3.

The first and second monitors 1, 2 are substantially rectangular. In this embodiment, the first and second monitors 1, 2 do not have rounded corners, but is not limited thus in other embodiments. The first monitor 1 has two parallel first long ends, two parallel first short ends that are shorter than the first long ends, and that interconnect and are perpendicular to the first long ends, and opposite first screen and mounting surfaces 11, 12 that are surrounded by the first long ends and the first short ends. The second monitor 2 has two parallel second long ends, two parallel second short ends that are shorter than the second long ends, and that interconnect and are perpendicular to the second long ends, and opposite second screen and mounting surfaces 21, 22 that are surrounded by the second long ends and the second short ends.

In this embodiment, a first direction (D1) is defined as a vertical direction, a second direction (D2) is defined as a horizontal direction perpendicular to the first direction (D1), and a third direction (D3) is defined as a front-rear direction perpendicular to both the first and second directions (D1, D2).

The monitor support device 3 includes a base support 31 that is elongated in the first direction (D1) and that has a connecting portion 312a, and first and second supports 32, 33 that are mounted to the base support 31 and that are respectively disposed at opposite sides of the connecting portion 312a of the base support 31 in the second direction (D2). The base support 31 includes a base seat 311, and a post member 312 extending rotatably in the first direction (D1), mounted to the base seat 311. A vertical end portion of the post member 312 constitutes the connecting portion 312a of the base support 31. In this embodiment, the first direction (D1) extends upwardly, and the connecting portion 312a faces upwardly. In other embodiments, for example, where the monitor support device 3 is mounted to a ceiling and the first direction (D1) extends downwardly, the connecting portion 312a may face downwardly.

The first support 32 includes a first connecting body 321 and a first mounting body 322. The first connecting body 321 is mounted to the connecting portion 312a of the base support 31 and is rotatable relative to the base support 31 about a first rotational axis (RA1) which extends in the second direction (D2). The first mounting body 322 is mounted to an end of the first connecting body 321 distal from the base support 31, is mounted with the first monitor 1, and is rotatable relative to the first connecting body 321 about a second rotational axis (RA2). The first and second rotational axes (RA1), (RA2) define a 45° angle (A1) therebetween. It should be noted that the first rotational axis (RA1) is fixed in position relative to the base support 31 and the second rotational axis (RA2) is fixed in position relative to the first connecting body 321. That is, when the first connecting body 321 is rotated relative to the base support 31, the second rotational axis (RA2) also rotates about the first rotational axis (RA1) while maintaining the 45° angle (A1) therebetween.

The first monitor 1, being mounted to the first support 32, is rotatable about the first rotational axis (RA1) between front-facing and rear-facing states, and about the second rotational axis (RA2) between vertical and horizontal orientations. In this embodiment, the first screen surface 11 of the first monitor 1 faces in the third direction (D3) in the front-facing state and faces against the third direction (D3) in the rear-facing state. At the vertical orientation, the first short ends extend horizontally and the first long ends extends vertically. At the horizontal orientation, the first short ends extend vertically and the first short ends extend horizontally. The first screen surface 11 is rotated to face an opposite side when the first monitor 1 is converted directly from one of the vertical and horizontal orientations to the other one of the vertical and horizontal orientations by rotating the first monitor 1 about the second rotational axis (RA2).

The second support 33 includes a second connecting body 331 and a second mounting body 332. The second connecting body 331 is mounted to the connecting portion 312a of the base support 31, and is rotatable relative to the base support 31 about the first rotational axis (RA1). The second mounting body 332 is mounted to an end of the second connecting body 331 distal from the base support 31, is mounted with the second monitor 2, and is rotatable relative to the second connecting body 331 about a third rotational axis (RA3). The first and third rotational axes (RA1), (RA3) define a 45° angle (A2) therebetween. The third rotational axis (RA3) is fixed in position relative to the second connecting body 331 and also rotatable about the first rotational axis (RA1) while maintaining the 45° angle (A2) therebetween when the second connecting body 331 is rotated relative to the first rotational axis (RA1).

The second monitor 2, being mounted to the second support 33, is rotatable about the first rotational axis (RA1) between front-facing and rear-facing states, and about the third rotational axis (RA3) between vertical and horizontal orientations. In this embodiment, the second screen surface 21 of the second monitor 2 faces in the third direction (D3) in the front-facing state and faces against the third direction (D3) in the rear-facing state. At the vertical orientation, the second short ends extend horizontally and the second long ends extends vertically. At the horizontal orientation, the second short ends extend vertically and the second short ends extend horizontally. The second screen surface 21 is rotated to face an opposite side when the second monitor 2 is converted directly from one of the vertical and horizontal orientations to the other one of the vertical and horizontal orientations by rotating the second monitor 2 about the third rotational axis (RA3).

In this embodiment, the first and second connecting bodies 321, 331 are polygonal plates, and the first and second mounting bodies 322, 332 are U-shaped frames, but are not limited thus and may be adjusted according to requirements in other embodiments.

The post member 312 is rotatable about a fourth rotational axis (RA4) which is parallel to the first direction (D1).

In this embodiment, each of the first and second monitors 1, 2 further has a proximal vertex which is a point always most proximal to the other one of the first and second monitors 1, 2.

Referring to FIGS. 1, 3, 4 and 5, when the first and second monitors 1, 2 are at the front-facing state, to change the orientation of the first and second monitors 1, 2 from the vertical orientation to the horizontal orientation, the first and second monitors 1, 2 may be pivoted at a 45° angle away from the base support 31 to respectively rotate the first and second mounting bodies 322, 332 about the second and third rotational axis (RA2, RA3) rearwardly, so as to be converted to the rear-facing state and the horizontal orientation.

Figure 6:
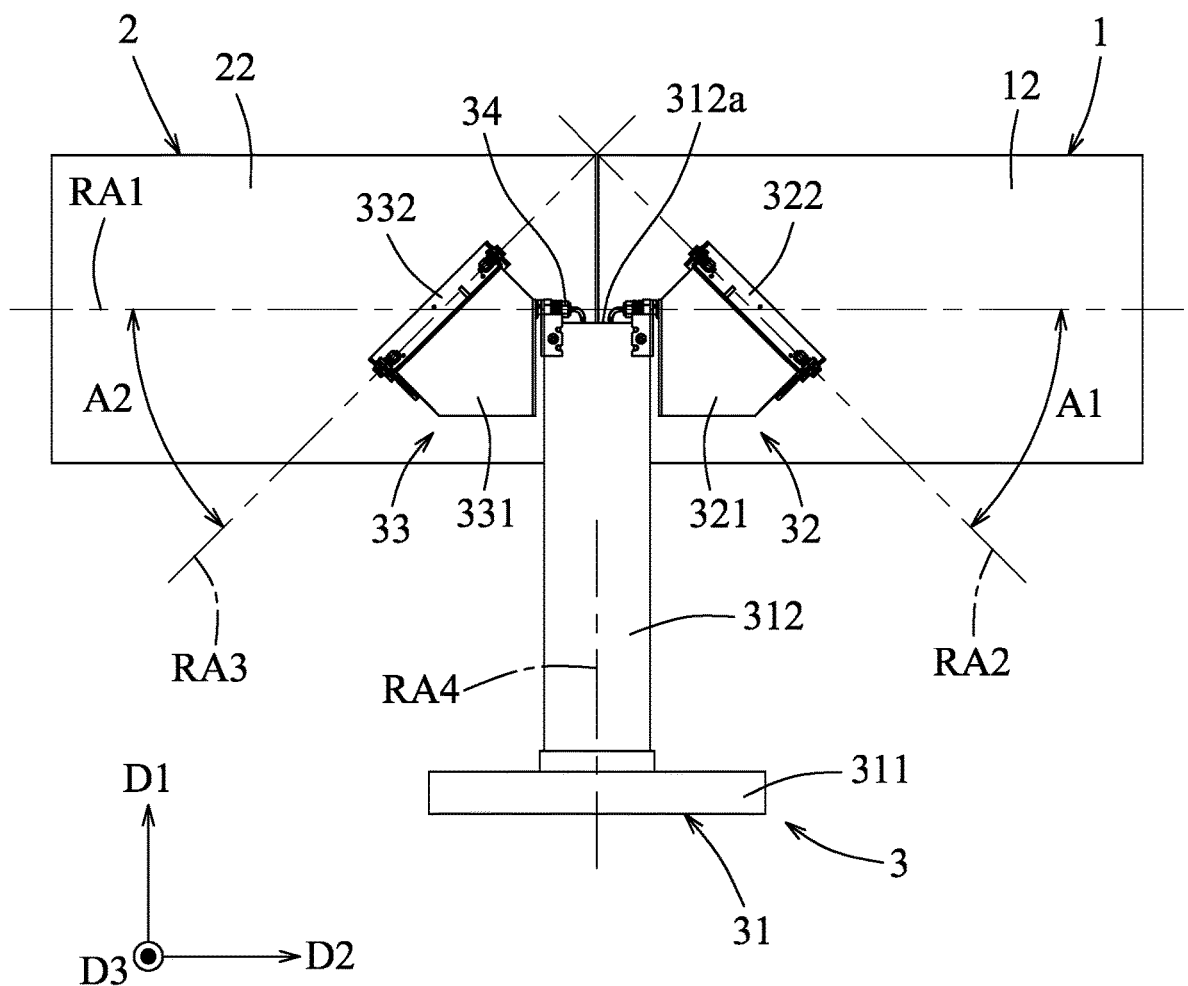
FIG. 6 is a side view of FIG. 5.

Referring to FIGS. 3 and 6, when the first monitor 1 is in one of the horizontal and vertical orientations and simultaneously in one of the front-facing and rear-facing states, the second rotational axis (RA2) overlaps in the third direction (D3) with the proximal vertex of the first monitor 1. When the second monitor 2 is in one of the horizontal and vertical orientations and simultaneously in one of the front-facing and rear-facing states, the third rotational axis (RA3) overlaps in the third direction (D3) with the proximal vertex of the second monitor 2.

Figure 5:
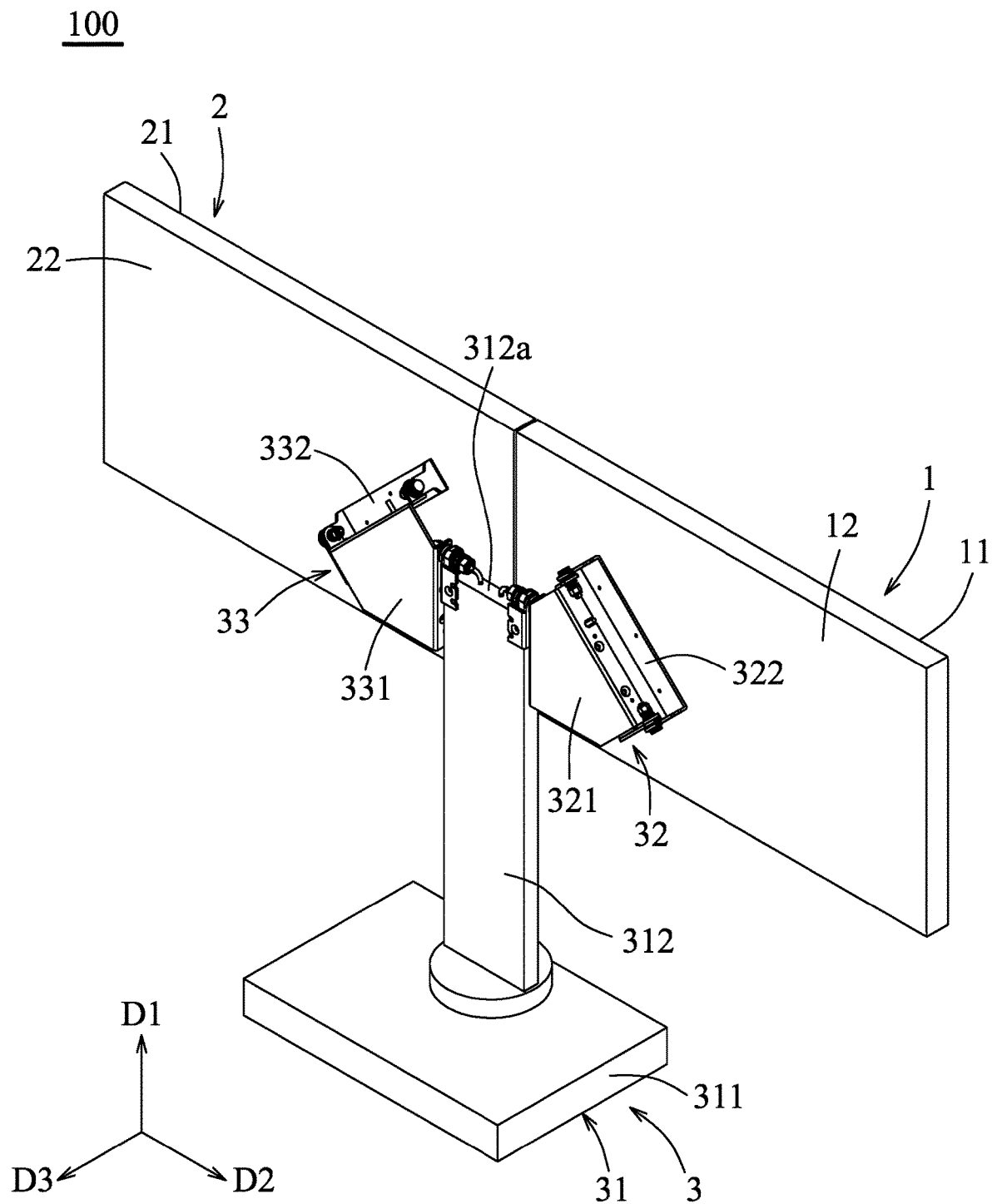
FIG. 5 is a perspective view of the embodiment, illustrating the first and second monitors in the horizontal orientation and the rear-facing state.
Figure 7:
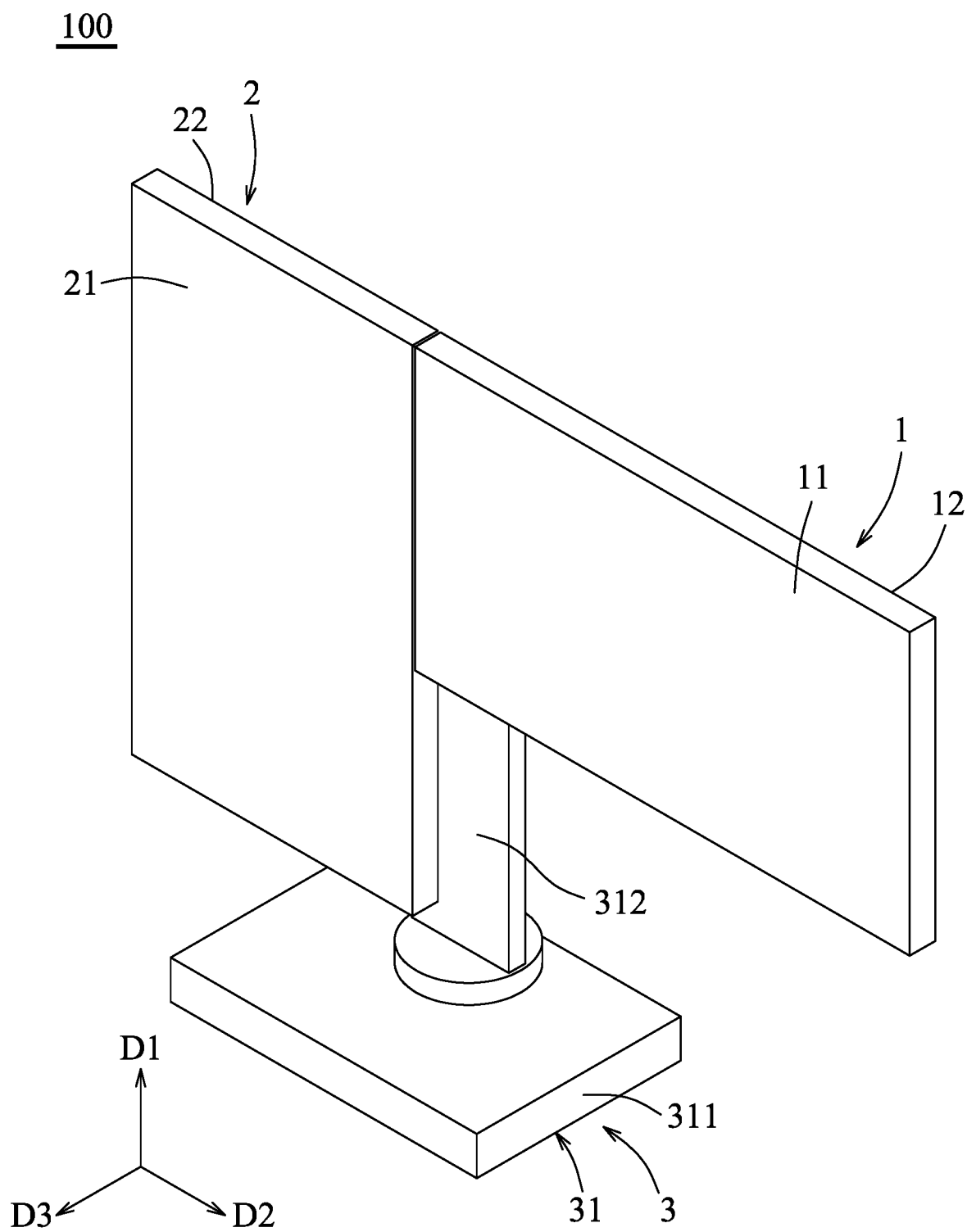
FIG. 7 is a perspective view of the embodiment, illustrating the first monitor in the horizontal orientation and the front-facing state, and the second monitor in the vertical orientation and the front-facing state.

Referring to FIGS. 1, 5, 7, the respective alignment of the second and third rotational axes (RA2, RA3) with the vertices of the first and second monitors 1, 2 allows the minimum distance between the first and second monitors 1, 2 in the second direction (D2) to be unchanged when rotated respectively about the second and third rotational axes (RA2, RA3) to the front-facing or rear-facing states. In this embodiment, when the first monitor 1 is in the front-facing state and the second monitor 2 is in the front-facing state (regardless of orientation of the first and second monitors 1, 2), the first and second monitors 1, 2 are adjacent to each other in the second direction (D2), and when the first monitor 1 is in the rear-facing state and the second monitor 2 is in the rear-facing state (also regardless of orientation of the first and second monitors 1, 2), the first and second monitors 1, 2 are adjacent to each other in the second direction (D2). Specifically, the first and second monitors 1, 2 are still adjacent to each other in the second direction (D2) even when respectively in different orientations, as long as the first and second monitors 1, 2 are in the same one of the front-facing and rear-facing states.

Referring to FIGS. 5 and 6, when the first monitor 1 is in the horizontal orientation and simultaneously at one of the front-facing and rear-facing states, the first rotational axis (RA1) overlaps in the third direction (D3) with a horizontal center line of the first monitor 1 which extends in the second direction (D2). When the second monitor 2 is in the horizontal orientation and simultaneously at one of the front-facing and rear-facing states, the first rotational axis (RA1) overlaps in the third direction (D3) with a horizontal center line of the second monitor 2 which extends in the second direction (D2).

Figure 8:
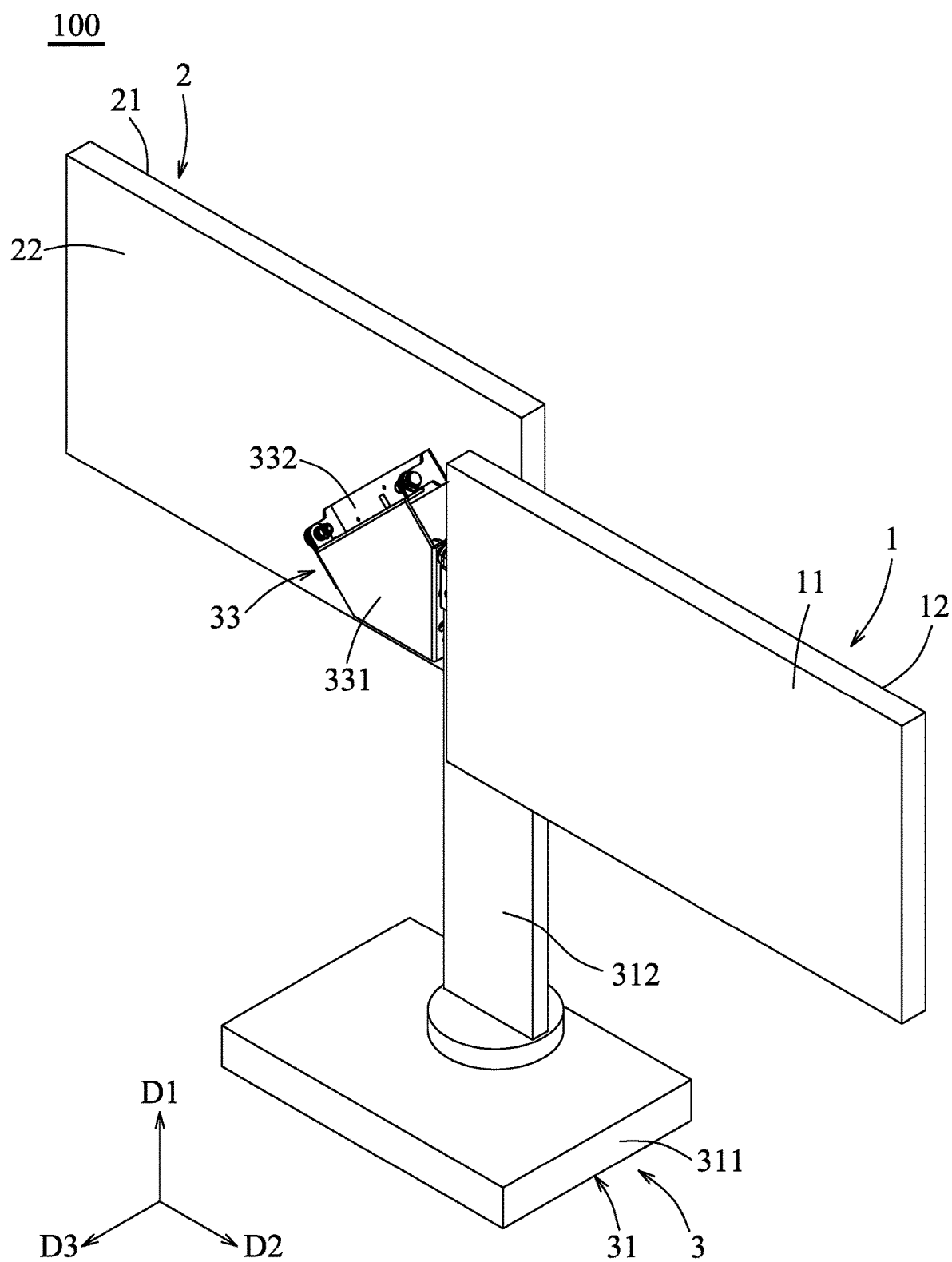
FIG. 8 is a perspective view of the embodiment, illustrating the first monitor in the horizontal orientation and the front-facing state, and the second monitor in the horizontal orientation and the rear-facing state.
Figure 9:
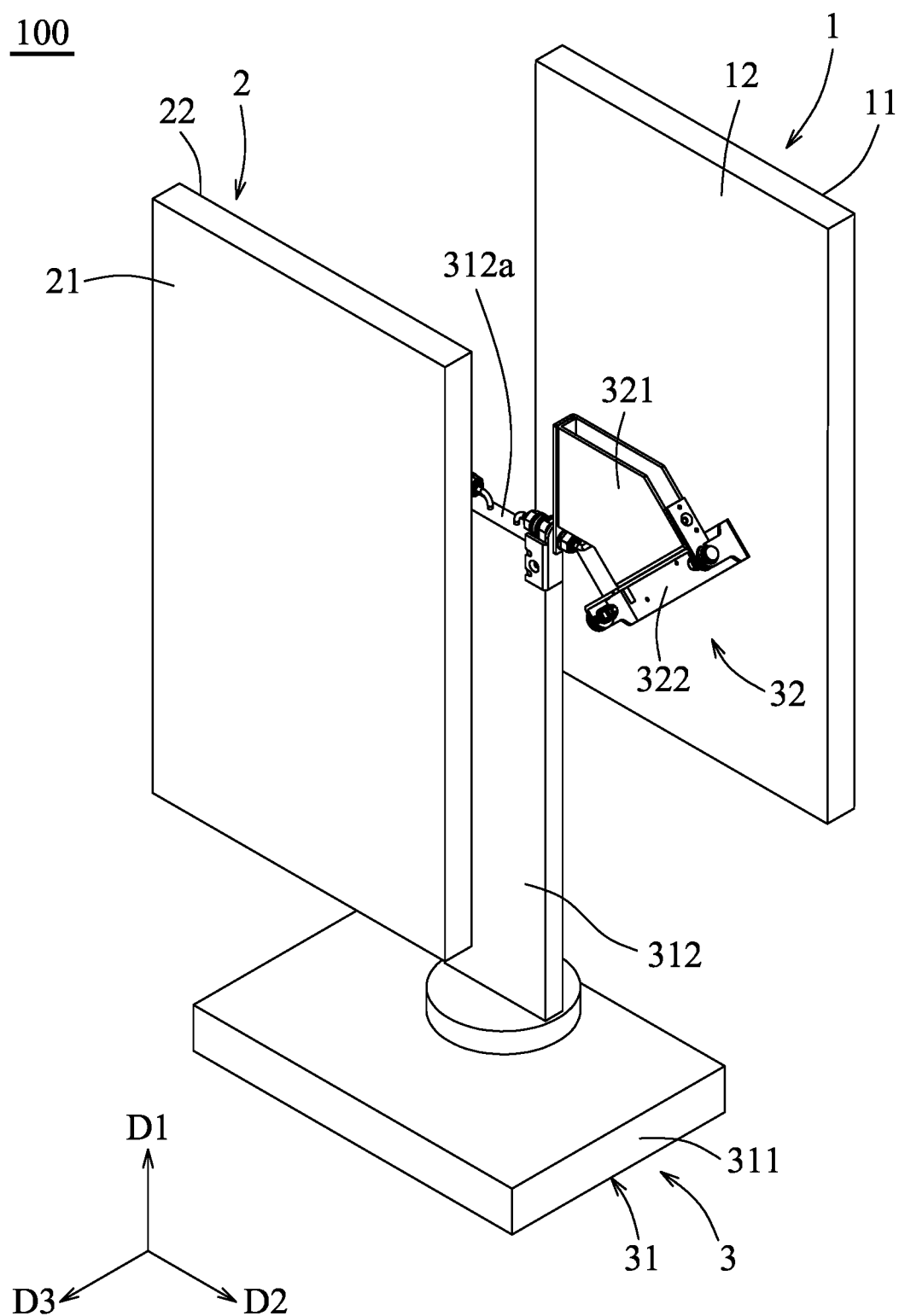
FIG. 9 is a perspective view of the embodiment, illustrating the first monitor in the vertical orientation and the rear-facing state, and the second monitor in the vertical orientation and the front-facing state.
Figure 10:
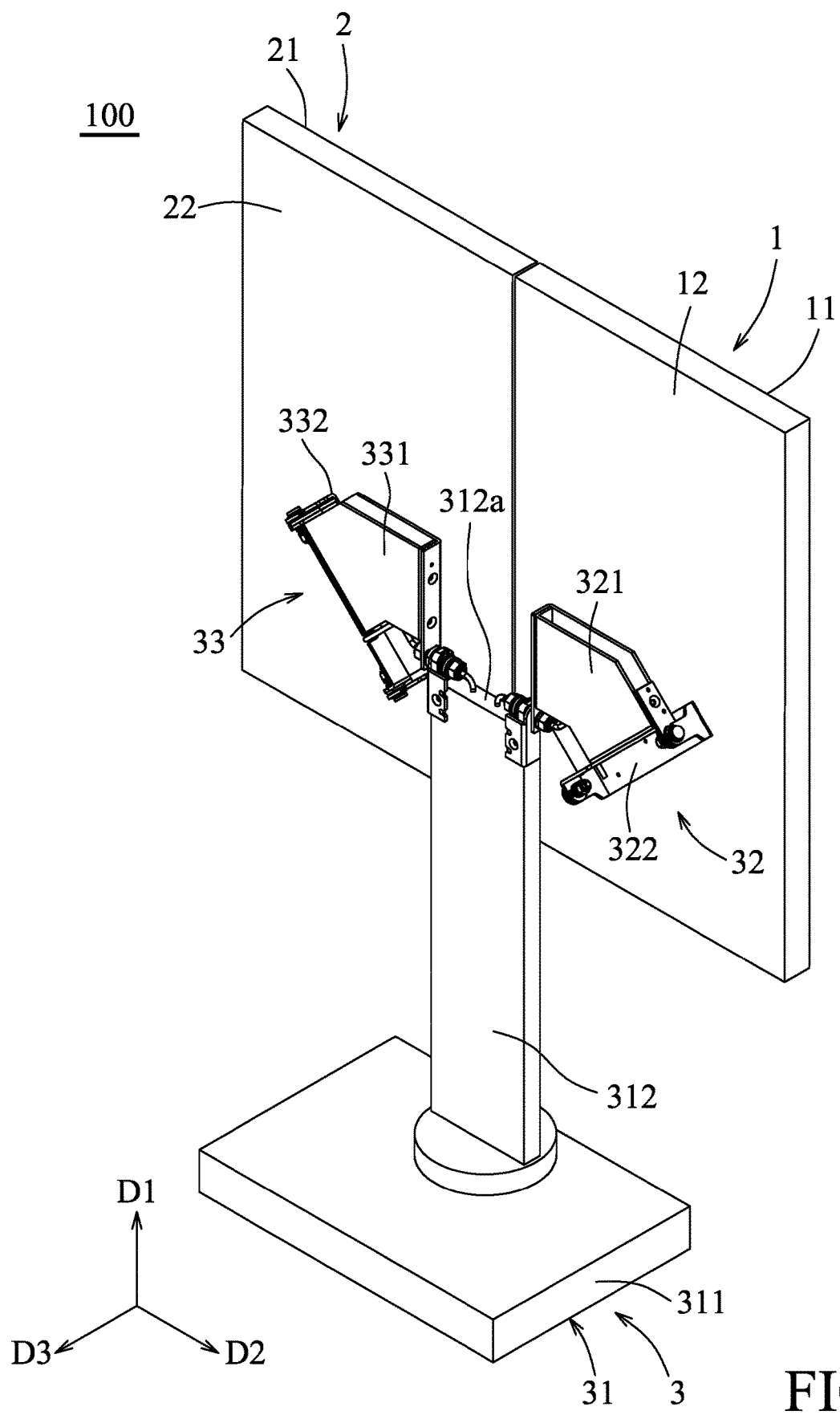
FIG. 10 is a perspective view of the embodiment, illustrating the first and second monitors in the vertical orientation and the rear-facing state.

Referring to FIGS. 6 and 8, the alignment of the first rotational axis (RA1) with the first and second monitors 1, 2 at the horizontal orientation allows each of the first and second monitors 1, 2 to be at the same height relative to the base support 31 when in the horizontal orientation and rotated about the first rotational axis (RA1) to the front-facing or rear-facing states. For example, to convert the first monitor 1 in the horizontal orientation from the rear-facing state to the front-facing state, the first monitor 1 may be pivoted forwardly to rotate the first connecting body 321 about the rotational axis (RA1) forwardly relative to the support base 31, after which the height of the first monitor 1 is the same as when in the rear-facing state. Moreover, as shown in FIG. 8, the first and second monitors 1, 2 may be respectively at the front-facing and rear-facing states and at the same height so as to permit viewing from opposite sides.

Referring to FIGS. 1, 3, 9 and 10, to convert the first and second monitors 1, 2 in the vertical orientation from the front-facing state to the rear-facing state, the first and second monitors 1, 2 may be individually pivoted upwardly to respectively bring the first and second connecting bodies 321, 331 to rotate about the first rotational axis (RA1) relative to the base support 31.

Figure 11:
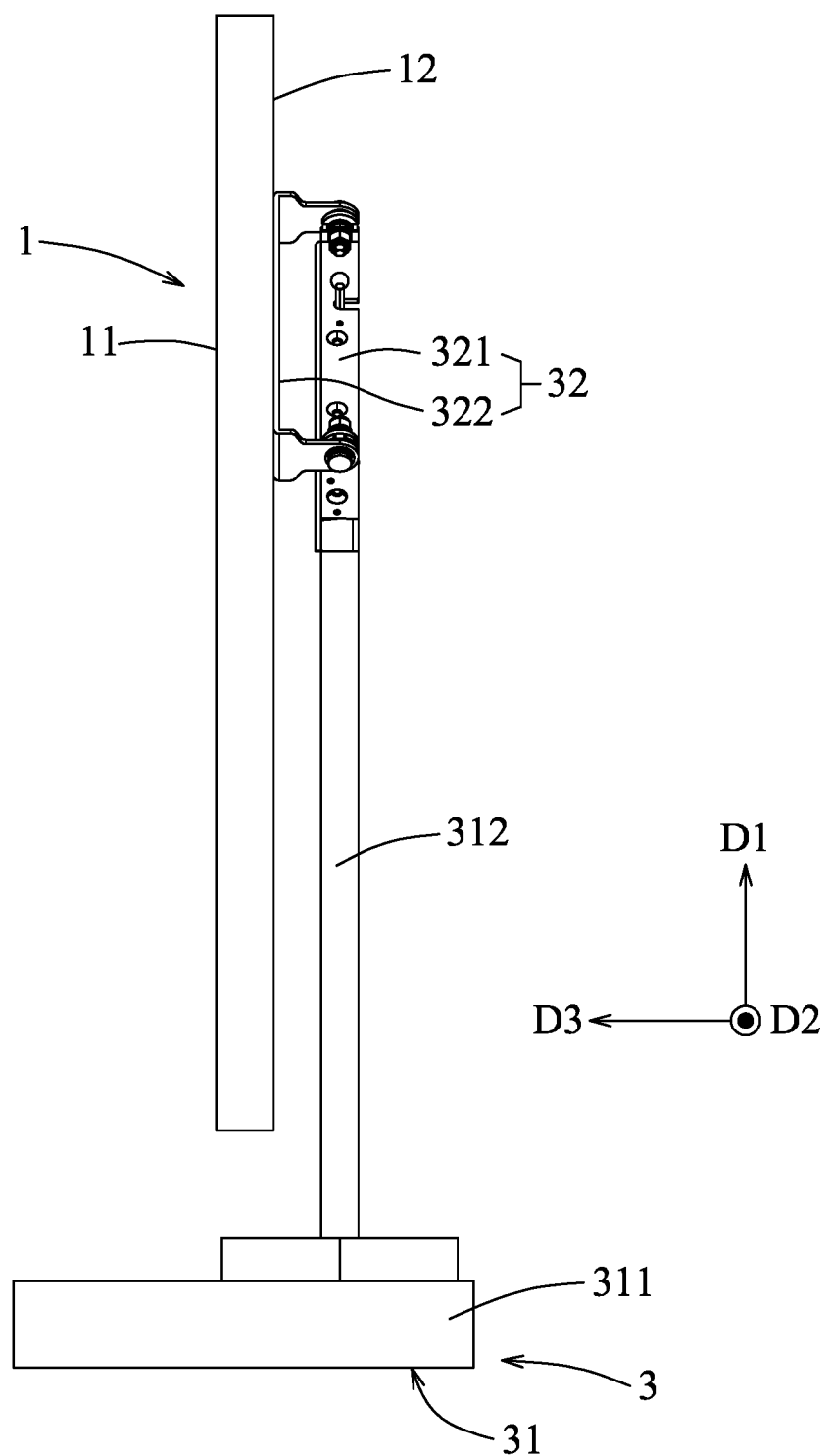
FIG. 11 is a side view of the embodiment, illustrating the first and second monitors in the vertical orientation and the front-facing state.
Figure 12:
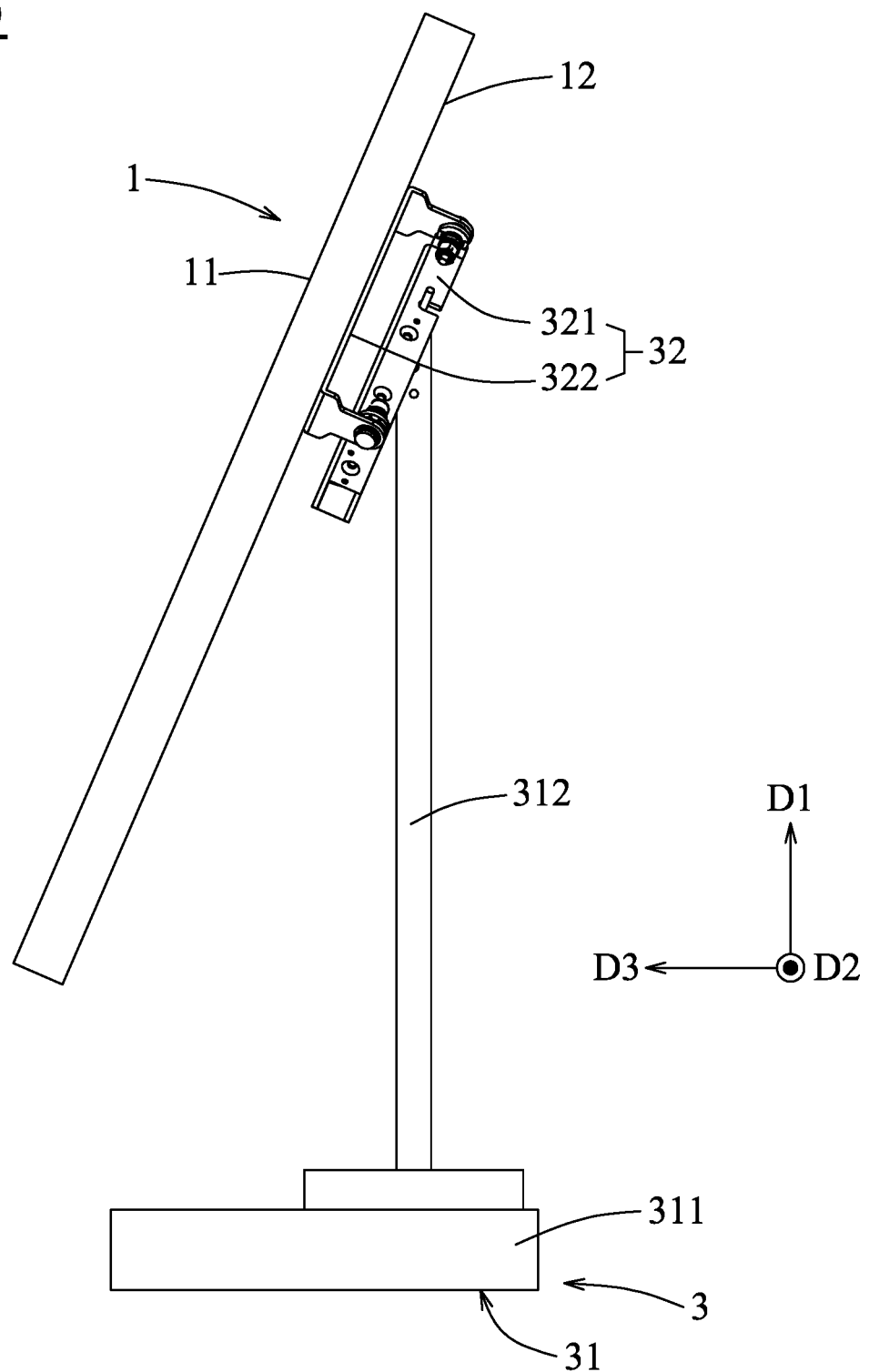
FIG. 12 is a side view of the embodiment, illustrating the first and second monitors positioned at an angle to a first direction.
Figure 13:
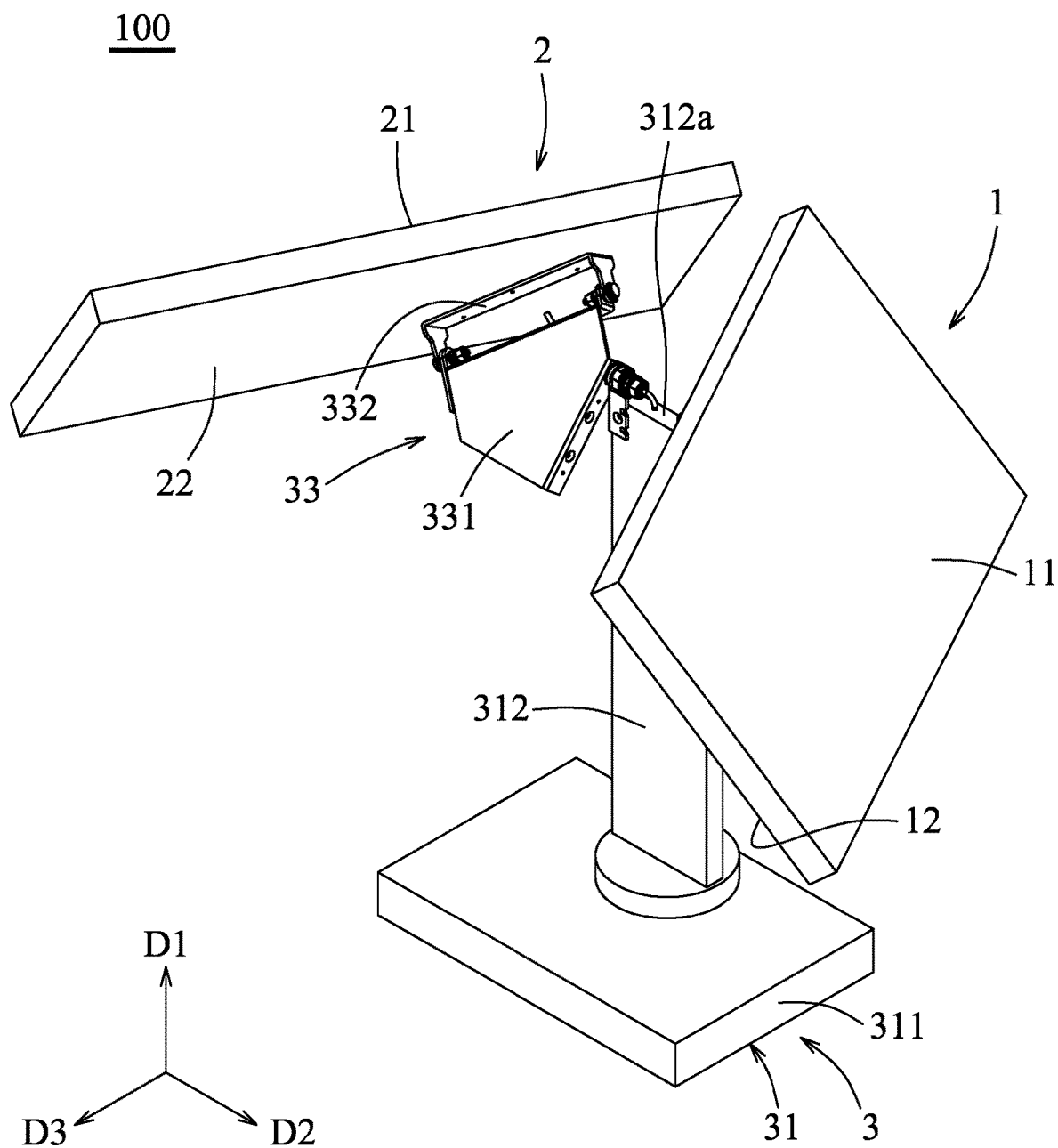
FIG. 13 is a perspective view of the embodiment, illustrating first and second screen surfaces of the first and second screens facing different directions.
Figure 14:
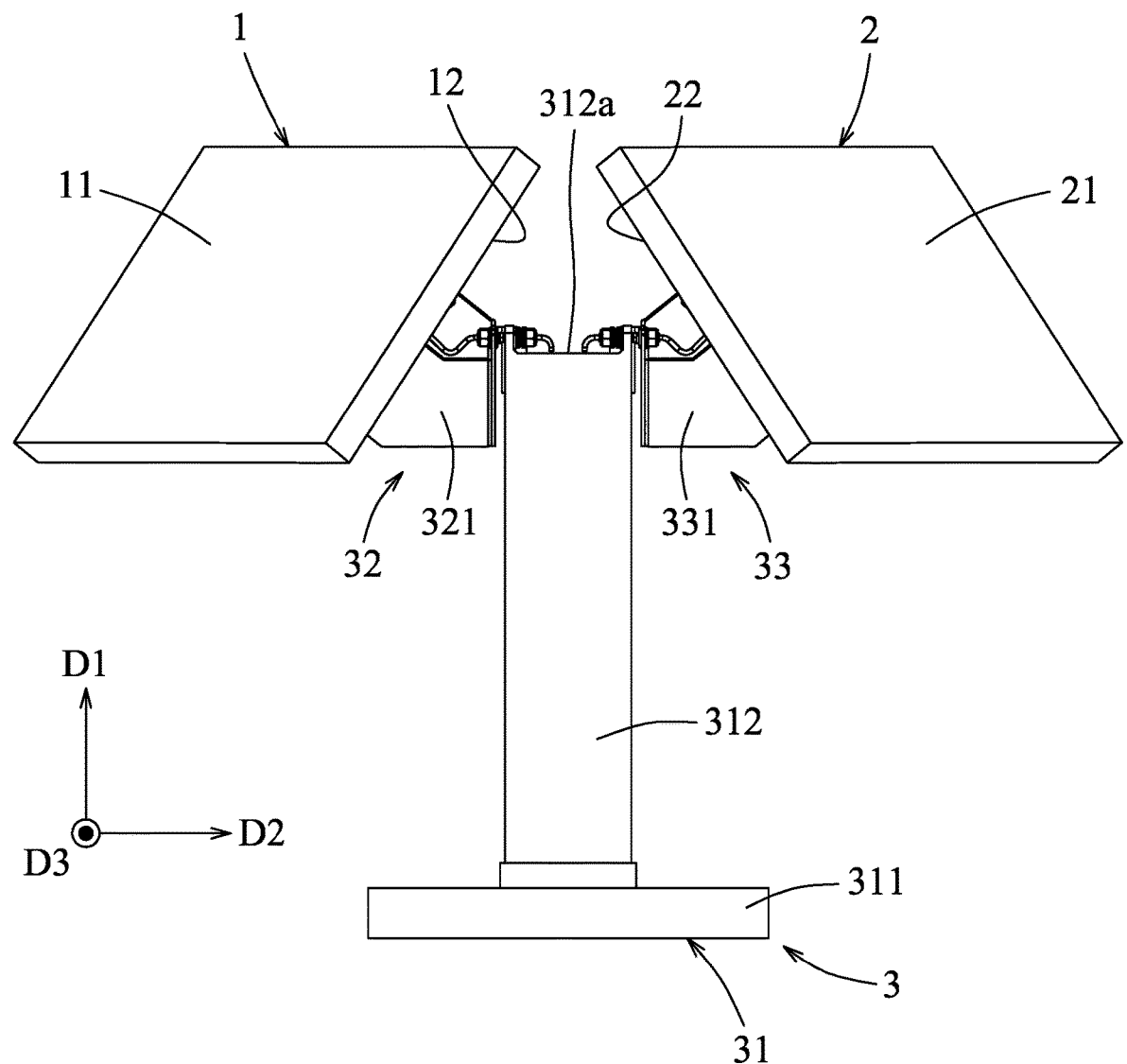
FIG. 14 is a side view of FIG. 13.

Referring to FIGS. 3, and 11 to 14, each of the first and second connecting members 321, 331 is connected to the connecting end portion 312a of the base support 31 and to a respective one of the first and second mounting members 322, 332 via a plurality of axle members 34 to form two hinges. In this embodiment, each of the axle members 34 provides a torque so that the four hinges of the monitor support device 3 have position control. That is to say, each of the first and second monitors 1, 2 may be positioned at an angle to the first direction (D1) as shown in FIGS. 11 and 12 by being rotated about the first rotational axis (RA1), and may also be rotated about a respective one of the second and third rotational axes (RA2, RA3) so that the first and second screen surfaces 11, 12 face different directions, as shown in FIGS. 13 and 14.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A monitor support device adapted to be mounted with substantially rectangular first and second monitors, said monitor support device comprising:
   abase support being elongated in a first direction and having a connecting portion; and
   first and second supports respectively disposed on opposite sides of said connecting portion of said base support in a second direction which is perpendicular to the first direction;
   wherein said first support includes
      a first connecting body that is mounted to said connecting portion of said base support, and that is rotatable relative to said base support about a first rotational axis which extends in the second direction, and
      a first mounting body that is mounted to an end of said first connecting body distal from said base support, that is adapted to be mounted with the first monitor, and that is rotatable relative to said first connecting body about a second rotational axis, the first and second rotational axes defining a 45° angle therebetween; and
   wherein said second support includes a second connecting body that is mounted to said connecting portion of said base support, and that is rotatable relative to said base support about the first rotational axis, and a second mounting body that is mounted to an end of said second connecting body distal from said base support, that is adapted to be mounted with said second monitor, and that is rotatable relative to said second connecting body about a third rotational axis, the first and third rotational axes defining a 45° angle therebetween.

2. The monitor support device as claimed in claim 1, wherein:

the first direction is a vertical direction, and the second direction is a horizontal direction;

said base support includes a base seat, and a post member extending in the first direction, mounted to said base seat, and being rotatable about a fourth rotational axis which extends in the first direction, a vertical end portion of said post member constituting said connecting portion of said base support.

3. A display apparatus comprising:

a substantially rectangular first monitor;

a substantially rectangular second monitor; and a monitor support device including a base support that is elongated in a first direction and that has a connecting portion; and first and second supports that are respectively disposed at opposite sides of said connecting portion of said base support in a second direction which is perpendicular to the first direction;

wherein said first support includes a first connecting body mounted to said connecting portion of said base support, and being rotatable relative to said base support about a first rotational axis which extends in the second direction, and a first mounting body mounted to an end of said first connecting body distal from said base support, mounted with said first monitor, and being rotatable relative to said second connecting body about a second rotational axis, the first and second rotational axes defining a 45° angle therebetween; and wherein said second support includes a second connecting body mounted to said connecting portion of said base support, and rotatable relative to said base support about the first rotational axis, and a second mounting body mounted to an end of said second connecting body distal from said base support, mounted with said second monitor, and being rotatable relative to said second connecting body about a third rotational axis, the first and third rotational axes defining a 45° angle therebetween.

4. The display apparatus as claimed in claim 3, wherein:

the first direction is a vertical direction, and the second direction is a horizontal direction;

said first monitor has two parallel first long ends, two parallel first short ends that are shorter than said first long ends, and that interconnect and are perpendicular to said first long ends, and a first screen surface that is surrounded by said first long ends and said first short ends;

said second monitor has two parallel second long ends, two parallel second short ends that are shorter than said second long ends, and that interconnect and are perpendicular to said second long ends, and a second screen surface that is surrounded by said second long ends and said second short ends;

each of said first and second monitors is rotatable about the first rotational axis between a front-facing state and a rear-facing state;

said first monitor is rotatable about the second rotational axis between a vertical orientation, where said first short ends extend horizontally and where said first long ends extends vertically, and a horizontal orientation, where said first short ends extend vertically and where said first short ends extend horizontally, said first screen surface being rotated to face an opposite side when said first monitor is converted directly from one of the vertical and horizontal orientations to the other one of the vertical and horizontal orientations; and said second monitor is rotatable about the third rotational axis between a vertical orientation, where said second short ends extend horizontally and where said second long ends extends vertically, and a horizontal orientation, where said second short ends extend vertically and where said second short ends extend horizontally, said second screen surface being rotated to face an opposite side when said second monitor is converted directly from one of the vertical and horizontal orientations to the other one of the vertical and horizontal orientations.

5. The display apparatus as claimed in claim 4, wherein:

each of said first and second monitors further has a proximal vertex which is a point always most proximal to the other one of said first and second monitors;

when said first monitor is in one of the horizontal and vertical orientations and simultaneously in one of the front-facing and rear-facing states, the second rotational axis overlaps in a third direction with said proximal vertex of said first monitor, the third direction being perpendicular to both the first and second directions; and when said second monitor is in one of the horizontal and vertical orientations and simultaneously in one of the front-facing and rear-facing states, the third rotational axis overlaps in the third direction with said proximal vertex of said second monitor.

6. The display apparatus as claimed in claim 4, wherein:

when said first monitor is in the horizontal orientation and simultaneously at one of the front-facing and rear-facing states, the first rotational axis overlaps in a third direction with a horizontal center line of said first monitor which extends in the second direction, the third direction being perpendicular to both the first and second directions; and when said second monitor is in the horizontal orientation and simultaneously at one of the front-facing and rear-facing states, the first rotational axis overlaps in the third direction with a horizontal center line of said second monitor which extends in the second direction.

7. The display apparatus as claimed in claim 4, wherein:

when said first monitor is in the front-facing state and said second monitor is in the front-facing state, said first and second monitors are adjacent to each other in the second direction; and when said first monitor is in the rear-facing state and said second monitor is in the rear-facing state, said first and second monitors are adjacent to each other in the second direction.

8. The display apparatus as claimed in claim 4, wherein said base support includes abase seat, and a post member extending in the first direction, mounted to said base seat, and being rotatable about a fourth rotational axis which is parallel to the first direction, a vertical end portion of said post member constituting said connecting portion of said base support.

\* \* \* \* \*